United States Patent
Krueger et al.

(10) Patent No.: US 9,714,998 B2
(45) Date of Patent: Jul. 25, 2017

(54) METHOD AND APPARATUS FOR PERFORMING GUIDED AND FLEXIBLE SELF-NAVIGATED STRUCTURAL MRI FOR MOTION COMPENSATION

(71) Applicant: SIEMENS AKTIENGESELLSCHAFT, Munich (DE)

(72) Inventors: Gunnar Krueger, Ecublens (CH); Davide Piccini, Prilly (CH)

(73) Assignee: Siemens Aktiengesellschaft, Munich (DE)

(*) Notice: Subject to any disclaimer, the term of this patent is extended or adjusted under 35 U.S.C. 154(b) by 577 days.

(21) Appl. No.: 14/325,999

(22) Filed: Jul. 8, 2014

(65) Prior Publication Data
US 2015/0015255 A1    Jan. 15, 2015

(30) Foreign Application Priority Data

Jul. 10, 2011   (EP) .................................. 13175939

(51) Int. Cl.
G01R 33/565    (2006.01)
G01R 33/567    (2006.01)
G01R 33/48     (2006.01)

(52) U.S. Cl.
CPC ... G01R 33/56509 (2013.01); G01R 33/5676 (2013.01); G01R 33/4826 (2013.01)

(58) Field of Classification Search
USPC ............... 324/300–322; 600/407–435, 595; 382/128–131
See application file for complete search history.

(56) References Cited

U.S. PATENT DOCUMENTS

| | | | |
|---|---|---|---|
| 5,933,006 A | 8/1999 | Rasche et al. | |
| 2006/0129069 A1* | 6/2006 | Apkarian | A61B 5/103 600/595 |

(Continued)

OTHER PUBLICATIONS

Tobias Kober et al., "Head Motion Detection Using FID Navigators", Magnetic Resonance in Medicine, 2011, vol. 66 No. 1. pp. 135-143.

(Continued)

*Primary Examiner* — Melissa Koval
*Assistant Examiner* — Tiffany Fetzner
(74) *Attorney, Agent, or Firm* — Laurence Greenberg; Werner Stemer; Ralph Locher

(57) ABSTRACT

A method and a magnetic resonance imaging apparatus provide subject/object motion detection and correction during a MRI scan. The method includes generating via a magnetic resonance scanner a magnetic field gradient and a radio-frequency signal for the MRI scan. The radio-frequency signal contains a successive repetition of pulse sequences, each pulse sequence starting with a radio-frequency excitation pulse. A time between two successive radio-frequency excitation pulses are defined as a repetition time. Detecting, from a readout signal emitted in response to the pulse sequence, time-points in which motion has occurred. Interleaves are automatically created. A sampling of the k-space is performed by arranging k-space MRI readout signals acquired over each repetition time of the pulse sequence into several groups of interleaves of uniform k-space sampling reconstructing separately each subset of interleaves for obtaining low resolution MR images.

10 Claims, 3 Drawing Sheets

Interleaved Radial Pattern

Interleaved Spiral Pattern

(56) References Cited

U.S. PATENT DOCUMENTS

| | | | |
|---|---|---|---|
| 2008/0054899 A1 | 3/2008 | Aksoy et al. | |
| 2012/0243756 A1 | 9/2012 | Samsonov et al. | |
| 2014/0368194 A1* | 12/2014 | Bauer | G01R 33/4818 |
| | | | 324/309 |
| 2015/0015255 A1* | 1/2015 | Krueger | G01R 33/5676 |
| | | | 324/309 |
| 2015/0051479 A1* | 2/2015 | Pipe | A61B 5/055 |
| | | | 600/416 |
| 2016/0104279 A1* | 4/2016 | Li | G06K 9/52 |
| | | | 382/131 |
| 2016/0291106 A1* | 10/2016 | Fuderer | G01R 33/4824 |

OTHER PUBLICATIONS

S. Winkelmann et al., "An Optimal Radial Profile Order Based on the Golden Ratio for Time-Resolved MRI", IEEE Transactions on Medical Imaging, 2007, vol. 26, No. 1, p. 68.

H Bhat et al., "3D Projection Reconstruction Based Respiratory Motion Correction Technique for Free-Breathing Coronary MRA", Proceedings of the International Society for Magnetic Resonance in Medicine, 18th Scientific Meeting and Exhibition, Stockholm, Sweden Apr. 17, 2010, p. 669.

D. Piccini et al., "The Next Step in Self-Navigated Coronary MRI: A Hybrid Approach for Affine Motion Correction", Proceedings of the International Society for Magnetic Resonance in Medicine, 19th Annual Meeting and Exhibition, Montreal, Quebec. Apr. 23, 2011, p. 1271.

* cited by examiner

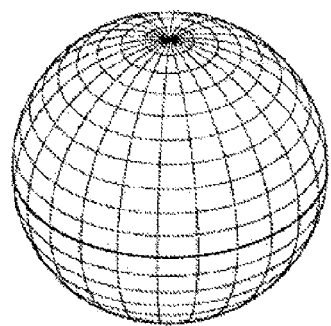
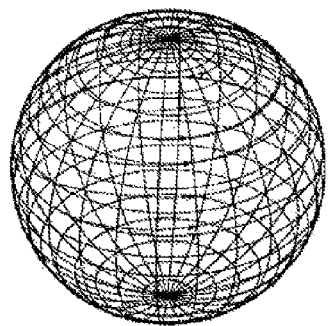
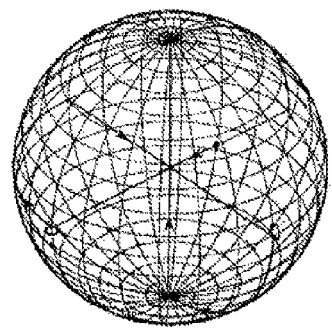
FIG. 1A
PRIOR ART
FIG. 1B
PRIOR ART
FIG. 1C
PRIOR ART
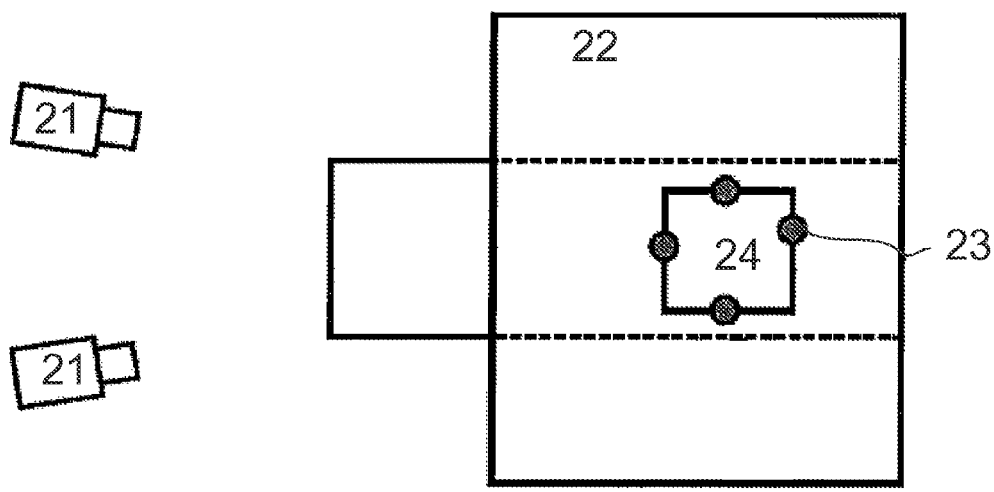
FIG. 2
PRIOR ART Interleaved Radial Pattern Interleaved Spiral Pattern

METHOD AND APPARATUS FOR PERFORMING GUIDED AND FLEXIBLE SELF-NAVIGATED STRUCTURAL MRI FOR MOTION COMPENSATION

CROSS-REFERENCE TO RELATED APPLICATION

This application claims the priority, under 35 U.S.C. §119, of European application EP 13 175 939.1, filed Jul. 10, 2013; the prior application is herewith incorporated by reference in its entirety.

BACKGROUND OF THE INVENTION

Field of the Invention

The invention relates generally to biomedical imaging, and more specifically to a method and a device for correcting defects in medical imaging caused by patient motion and occurring during magnetic resonance imaging (MRI).

For obtaining images using the technique of MRI, a subject/object has to be placed in a strong static magnetic field, which forces the hydrogen nuclear magnetic moments associated with the subject/object hydrogen nuclear spins to adopt an orientation parallel or anti-parallel with respect to a static magnetic field. The spin axes are not exactly aligned with the static magnetic field, but they process around a direction axis of the static magnetic field with a characteristic frequency, giving rise to a net magnetization in the direction of the static magnetic field. In order to stimulate a signal from the hydrogen nuclei, a radio-frequency (RF) excitation pulse can be applied to the subject at the aforementioned characteristic frequency, called Larmor frequency, which is for one type of nuclei proportional to the flux density of the magnetic field. The RF energy associated with the excitation pulse disturbs the net magnetization from its equilibrium, rotating it away from the static magnetic field with an angle, called a flip angle, which depends on the strength and duration of the magnetic component of the electromagnetic radio frequency radiation.

Consequently, the net magnetization begins to process around the static magnetic field's main axis, its transverse component inducing an electromotive force in a receiver coil according to Faraday's law of magnetic induction. The electromotive force gives rise to an induced signal that is emitted from the subject in response to the RF excitation pulse and magnetic field gradients applied to the subject. The induced signals, hereafter MRI readout signals or simply readouts, are at the basis of MR image reconstruction. The magnitude of this MRI readout signal depends, among other factors, on the number of nuclei that produce the magnetization, on their relaxation times, i.e. the time needed by the net magnetization to return to its equilibrium state along the axis of the strong magnetic field. Other factors include the so called spin preparation. Indeed, in order to optimize a diagnostic value of the signal, different MRI pulse sequences combining one or more RF excitation pulses might be used, wherein parameters like the repetition time of the pulse sequence, its echo time, the flip angle, its bandwidth, might be tuned and adapted in function of the parts/functions of the subject that have to be imaged.

Usually, the MRI spatial encoding is done in three dimensions. One dimension (e.g. along z) is determined by slice selective excitation, and the other two dimensions are usually determined respectively by applying a magnetic field gradient across the excited slice (along x—readout direction), and by applying a brief gradient pulse before each readout line of the MRI readout signal (along y—phase encoding). The k-space or k-space matrix, i.e. the representation in frequency domain of the MRI raw data provided by the MRI readout signal before it has been Fourier-transformed in order to make the final image of the object of interest, is usually represented as a matrix in two or three dimensions in which digitized MRI readout signals are stored during data acquisition. Usually, an analog-to-digital converter is used for the conversion of the analog signal resulting from the subject/object excitation to a series of digital values, i.e. the digitized MRI readouts, by measurement performed at different time T. Each readout is basically a group of k-space sample points. When the k-space is full, the k-space data are processed to produce the final image. In conventional MRI, k-space traversal patterns are used: the k-space is completed line by line by acquiring the data samples from the MRI readout signal.

One of the major problems often faced in the field of MRI is subject motion during data acquisition. The presence of motion usually results in image artefacts which can cause major problems in several post-processing procedures and can, in more extreme cases, even affect the diagnostic information. The problem of subject/patient motion during magnetic resonance (MR) acquisition time concerns especially children or elderly patients who cannot remain still for the whole duration of the measurement.

A common example is represented by neurological scans. In this kind of examinations, motion usually does not occur continuously throughout the whole acquisition, but takes place in one or more isolated time-points. The goal of motion correction techniques is to react to the occurrence of motion either by adapting the acquisition parameters during scan time as soon as motion is detected (prospective motion correction) or correcting the acquired motion-corrupted data before/during/after reconstruction (retrospective motion correction).

Three main issues with motion correction in brain scans concern are:

the exact identification of the time point(s) when motion has occurred (motion detection);

obtaining accurate motion parameters (in a rigid body model, 6 parameters/degrees of freedom) with minimal or no scan time extension; and correcting the motion corrupted data.

In recent years, several approaches have been presented in literature for the correction of patient motion occurring during MR examinations. Navigator techniques, for example, make use of additional sets of data, acquired before or after the actual imaging part of the sequence with the specific purpose of quantifying motion during the scan. Some k-space trajectories of different navigator techniques are presented in FIGS. 1A-1C. The orbital navigator readout (ONAV), for example, is able to detect 3D translation and rotation in-plane bulk motion (see FIG. 1A). This method is notably described in the paper of H. A. Ward et al. (H. A. Ward et al., titled *Prospective Multiaxial Motion Correction for fMRI*, Magn. Reson. Med. 43:459-469 (2000)). Its extension to a spherical trajectory (SNAV) allows to take into account also movements that are orthogonal to the image plane (see e.g. E. B. Welch et al., titled *Spherical Navigator Echoes for Full 3D Rigid Body Motion Measurement in MRI*, Magn. Reson. Med. 47:32-41 (2000); see respectively FIG. 1B. A very rapid detection of 3D translation and rotation can be obtained using the cloverleaf technique described in J. H. van der Kouwe et al., titled "Real-Time Rigid Body Motion Correction and Shimming Using Cloverleaf Navigators", Magn. Reson. Med. 56:559-569 (2006) (see FIG. 1C).

Instead of sampling just a portion of k-space to obtain motion information, some methods aim to acquire a complete image for navigation. An example of this kind of implementations is the Prospective Acquisition CorrEction (PACE) approach described in the paper of S. Thesen et al. (S. Thesen et al., titled "Prospective Acquisition Correction for Head Motion with Image-Based Tracking for Real-Time fMRI", Magn. Reson. Med. 44:457-465 (2000)). All of these techniques, however, require additional acquisition time and, therefore, represent a trade-off between the duration of the scan and the temporal resolution of the motion detection. In some cases, they are also limited in the achievable quality and resolution and may imply perturbations of the steady state magnetization due to additional RF pulses.

One way to avoid the increase in acquisition time is to make use of an external device (see FIG. 2), such as one or more cameras, to perform the motion tracking (see the article by e.g. M. Zaitslev et al., entitled "Magnetic Resonance Imaging of Freely Moving Objects: Prospective Real-Time Motion Correction Using an External Optical Motion Tracking System", Magn. Reson. Med. 44:457-465 (2006)). The main advantage of these approaches is that not only scan time is not increased, but also that motion correction is independent on the sequence used for acquisition. However, such external hardware is not commonly available and its set up can be both time consuming and relatively complex.

SUMMARY OF THE INVENTION

An objective of the present invention is to provide a method and a device for MRI patient motion compensation that overcome the above-mentioned problems of requiring additional external hardware and/or increasing significantly the acquisition time.

The objective is achieved according to the present invention with respect to a computer-implemented method for subject/object motion detection and correction during a MRI scan, in particular during a brain MRI scan. The computer-implemented method includes: generating via a magnetic resonance scanner a magnetic field gradient and a RF signal for the MRI scan, wherein the RF signal contains a successive repetition of at least one pulse sequence during the MRI scan. The pulse sequence starts in particular with an excitation pulse, e.g. an inversion excitation pulse, and the time between successive excitation pulses of successive pulse sequences being known as the repetition time (TR) of the pulse sequence. Detecting, from a MRI readout signal emitted by the subject/object in response to the pulse sequence, time-points in which motion has occurred by means of a motion detection technique configured for detecting in the readout signal occurrences of subject/object motion in function of the time and with high temporal precision. Preferentially, the motion detection technique is a navigator technique (also called navigator echo technique). Motion-free interleaves are then automatically created, i.e. motion-free subsets of subsequently acquired MRI readout signals. The sampling of k-space is performed by arranging k-space readout signals acquired during the repetition time into several groups of interleaves, wherein each interleave is characterized by a uniform and/or homogeneous sampling of the k-space, e.g. several groups of interleaves of radial and/or spiral readout signals (see FIGS. 1A-1C or 3A-3B). In order to achieve a uniform distribution of the interleaves independent of a time interval over which the interleaves are acquired, preferentially achieving a uniform angular distribution by using a golden angle displacement between successive interleaves. In particular, the golden angle displacement in case of a radial sampling of the k-space with the readout signals is defined as follows: each new radial readout signal acquired is shifted of a golden angle quantity (e.g. about 137.508°) with respect to the previously acquired radial readout signal. Advantageously, the result of such an acquisition of MRI signals and sampling of the k-space is that each further readout signal is automatically positioned in the k-space matrix in the largest gap left "unsampled" by all the previous acquisitions of readout signals. Consequently, the sampling never occurs at the same position in the k-space matrix, guaranteeing by the same way an uniform coverage of k-space "over time" allowing the low resolution image reconstruction presently claimed. Each group of radial and/or spiral interleaves according to the invention is thus a set of several interleaves for which the subject/object has the same position. In other words, within each group, no motion of the subject/object occurs. Advantageously, the k-space sampling according to the invention ensures that basically any subset containing a sufficient number of subsequently acquired interleaves provides both a dense sampling of k-space center and a reasonably uniform coverage of the more external regions of k-space at the same time. Reconstructing separately each subset of interleaves for obtaining low resolution MR images of the object to be imaged, for example low resolution MR brain images. Advantageously, since motion in head scans does not occur continuously, but "occasionally", each of these subsets is the result of an acquisition over several repetition times. For this reason and because of the previously described temporal uniformity of the k-space sampling, datasets reconstructed from each of the subsets have advantageously a sufficient image quality to be registered to each other and perform motion correction. The low resolution images are used for determining motion parameters by a computer and by registration to a reference image. The motion parameters are used to improve the quality of images obtained during the MRI scan. Preferentially, the motion parameters are sent in feedback to a motion correction system capable of adapting the pulse sequence for compensating the motion of the subject/object, e.g. by correcting gradients and slice orientation or used to "correct" the position of the acquired lines in k-space before/during reconstruction.

Usually, the navigator or navigator echo technique contains an acquisition of at least a partial set of k-space data resulting from applying to the object or subject to be imaged a radio-frequency pre-pulse performed after each RF excitation pulse that initiates each pulse sequence configured for being applied to a same slice of the object to be imaged, e.g. the subject's brain. The pulse sequence lasting a time period equal to the repetition time and configured for imaging the slice. The partial set of k-space data enables in particular a tracking of effects resulting from subject or object motion and occurring in MR images. Preferentially, the motion detection technique is a free induction decay (FID) navigator technique, i.e. the RF pre-pulse of the pulse sequence according to the invention is an ultra-short FID RF signal (typically<100 μsec) configured for monitoring k-space center in a manner free of any spatial gradient encoding (see e.g. T. Kober et al., titled "Head Motion Detection Using FID Navigators", Mag. Reson. Med., 66:135-143 (2011)). In particular, the pulse sequence according to the FID navigator technique contains an excitation pre-pulse performed after a delay $T_d$ after each RF excitation pulse, e.g. an inversion excitation pulse, delimiting the successive pulse sequences, and followed then by an analog-digital-converter (ADC) readout in an absence of any gradients and in particular before applying the gradients configured for performing spatial encoding.

The method according to the invention enables detecting head motion from a FID navigator or an equivalent motion detection technique at the beginning of each repetition time and extracting head motion information directly from the readouts acquired for imaging the head. Advantageously, the same data acquired for imaging are used to correct for motion leading therefore to no or little extra scan time and avoiding the use of external hardware. Each interleave according to the invention is a subsampled (i.e. not fully sampled) k-space formed by motion free MRI readouts. Each interleave according to the invention is characterized by a uniform spatial distribution of the MRI readout signals in the k-space which ensures obtaining low resolution MRI images. In particular, the uniform sampling of the k-space might be done by uniformly sampling the 3D k-space using non-Cartesian readouts (e.g. by using a 3D radial sampling in which radial readouts that always go through the k-space center are acquired) or by uniformly distributing Cartesian readouts in the phase encoding plane in k-space (e.g. by using a radial/spiral distribution of Cartesian readouts (see FIG. 3A), wherein each readout is acquired perpendicular to the phase encoding plane (all readouts being thus parallel along the z-direction), but distributed in a radial/spiral way). The use of a k-space acquisition optimized for self-navigation allows a splitting of the scan data (or readouts) in arbitrary subsets of motion free under sampled datasets, i.e. the interleaves, which allow a reconstruction of low resolution images that can be used to extract the motion parameters by registration to the reference image. Moreover, the uniform distribution of the samples in an inter leave gives the advantage that, when transformed into an image, the artefacts are much smaller than in a non-uniform case (wherein artefacts might ruin the image quality) such that the image registration can perform with sufficient precision.

The present invention also concerns a magnetic resonance imaging apparatus for imaging an object/subject. The apparatus contains a magnetic resonance scanner configured for generating a magnetic field gradient and a radio-frequency signal for performing a magnetic resonance scan of the subject/object. The radio-frequency signal contains a successive repetition of a pulse sequence. The pulse sequence starts in particular with an excitation pulse, e.g. an inversion excitation pulse, and the time between successive excitation pulses of successive pulse sequences being known as the repetition time of the pulse sequence. A detection system is configured for detecting and acquiring MRI readout signals emitted from the subject/object in response to the magnetic field gradient and radio-frequency signal. In particular, the detection system contains an ADC for the sampling of the k-space. A motion detection and tracking system is configured for detecting and tracking a subject/object motion and determining subject/object's motion parameters. The motion parameters contain at least time-points in which motion has occurred preferentially. A motion correction system is configured for automatically correcting effect of subject/object motion during MRI scan. For example, the motion correction system is able to calculate at least one gradient correction parameter in function of the motion parameters, and to determine a start time and a duration for applying the gradient correction parameter. In particular, the motion correction system is able to provide the magnetic resonance scanner with the gradient correction parameter for correcting at least one magnetic field gradient applied to the subject/object during the determined duration starting at the determined start time. Preferentially, the magnetic resonance scanner is further configured for correcting the at least one magnetic field gradient according to the gradient correction parameter and for applying the corrected magnetic field gradient during the duration starting at the start time. The motion detection and tracking system contains a computer processor and a memory storage containing instructions for automatically creating from the MRI readout signals motion-free interleaves. Wherein the sampling of the k-space is performed by arranging k-space MRI readout signals acquired over each repetition time of the pulse sequence into several groups of interleaves. Wherein each interleave is characterized by a uniform and/or homogeneous sampling of the k-space. Preferentially, the detection system is further configured for sampling the k-space according to a spiral and/or radial pattern in order to achieve radial and/or spiral interleaves according to the previously described method reconstructing separately each subset of interleaves for obtaining low resolution MR images using the low resolution images for determining motion parameters by a computational technique and by registration to a reference image using the motion parameters to improve the quality of images obtained during the MRI scan.

In particular, the memory storage of the magnetic resonance imaging apparatus according to the invention contains instructions for performing a navigator technique for detecting and tracking the motion of the subject/object. Preferentially, the FID navigator technique previously described in the method according to the invention is used.

Other features which are considered as characteristic for the invention are set forth in the appended claims.

Although the invention is illustrated and described herein as embodied in a guided and flexible self-navigated structural MRI for motion compensation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIGS. 1A-1C are illustrations of k-space trajectories of different navigator techniques according the prior art;

FIG. 2 is an illustration of a stereoscopic external motion detection setup according to the prior art;

DETAILED DESCRIPTION OF THE INVENTION

FIGS. 1A-2 presents techniques commonly used techniques for detecting and correcting subject motion during scan acquisition.

FIGS. 1A-1C illustrate prior art k-space trajectories of different navigator techniques. In particular, FIG. 1A shows an orbital navigator (ONAV) readout capable of detecting translational and rotational in-plane bulk motion, FIG. 1B illustrates a spherical navigator (SNAV) readout configured for detecting translational and rotational in-plane bulk motion, as well as movements orthogonal to the image plane, and finally FIG. 1C presents a cloverleaf navigator capable of detecting 3-dimensional translation and rotation rapidly.

FIG. 2 presents a stereoscopic external motion detection setup wherein two IR cameras 21 are positioned at approximately 4 meters distance from a scanner bore 22, pointing inside it. Close to the imaged volume, four IR-reflecting spheres 23 have to be rigidly attached to the object 24. Here, a phantom is depicted. Using the stereoscopic images, the three-dimensional displacement of the object 24 can be calculated in real-time. Evidently, this setup requires a free line-of-sight between the cameras 21 and the tracking spheres 23.

Figure 3A:
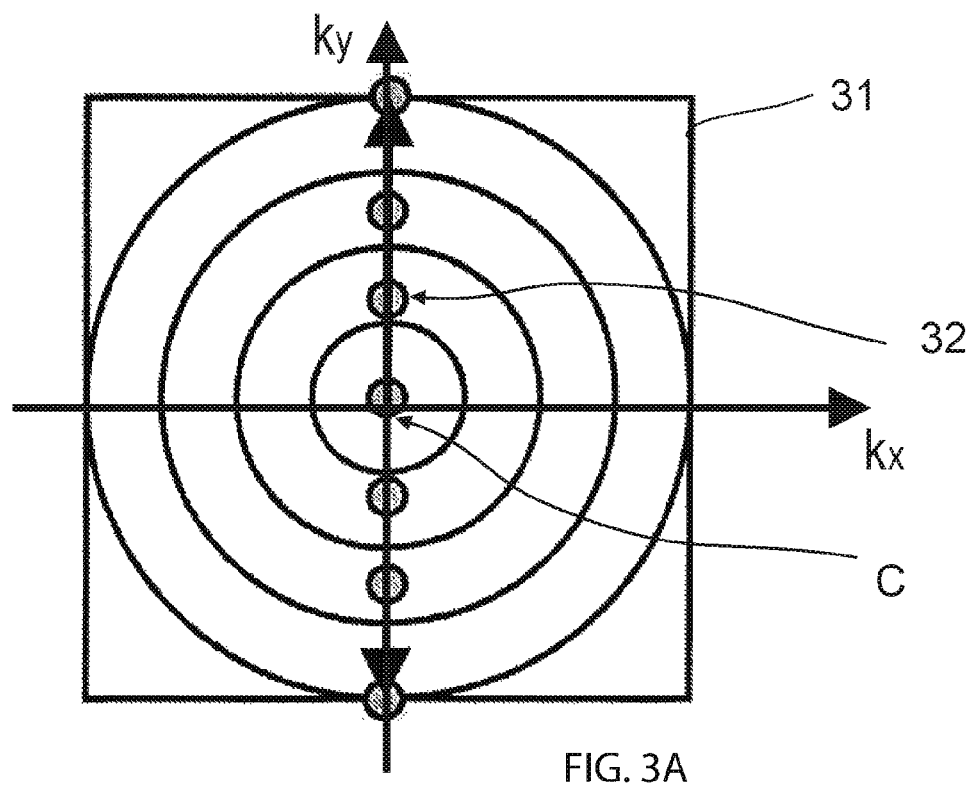
FIGS. 3A-3B are illustrations showing preferred interleaved sampling according to the invention.
Figure 3B:
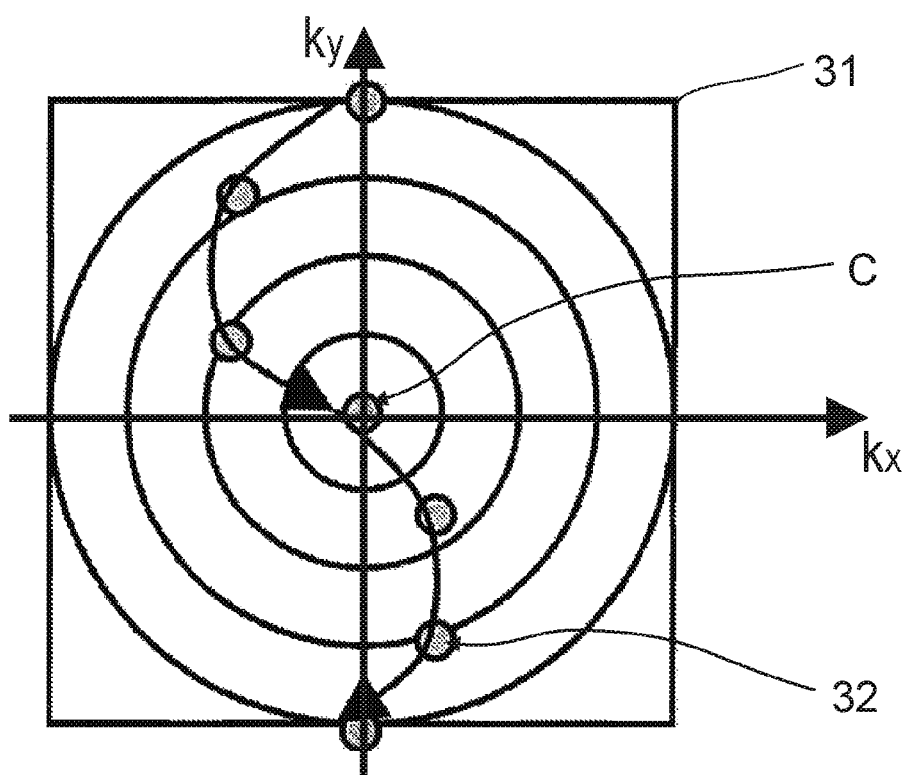

The present invention introduces new motion compensation in the field of structural MRI. Indeed, it proposes a k-space sampling pattern that provides a uniform spatial distribution of the MRI readouts over time in the k-space matrix and consequently allows computing low resolution images of the subject/object at any time. In particular, the sampling pattern of the k-space according to the present invention is a radial and/or spiral arrangement of the readout signals, which can in particular follow the golden-angle displacement rule, such that spatial distribution over time is ensured to be uniform. Preferred k-space sampling patterns according to the invention are shown in FIGS. 3A-3B, wherein a square 31 in FIGS. 3A and 3B represents the xy plane in k-space (i.e. the phase encoding plane), while each of the colored circles 32 represents a starting point of a MRI readout acquired in the z-direction. In FIGS. 3A and 3B are in particular represented an interleaved radial k-space sampling pattern (FIG. 3A), and an interleaved spiral (FIG. 3B) k-space sampling pattern. A radial readout according to the invention is in particular a linear readout (a straight line of samples in k-space) that always crosses a center C of the k-space (see FIG. 3A). A spiral readout according to the invention is in particular a non linear readout that has a spiral shape, and which preferentially starts from the center C of the k-space and "spirals out". The spiral readout can also start from an outer part of the k-space and spiral to the center C, stopping at the center C of k-space or continuing the spiral to an outer part of the k-space, wherein the outer part of k-space refers to large value of $k_x$, $k_y$ compared to centered values of $k_x$, $k_y$, large values of $k_x$, $k_y$ being e.g. readout data containing the maximum $k_x$ and/or $k_y$ value. The sampling of k-space is performed by arranging k-space lines acquired during each repetition time into several groups of the radial and/or spiral interleaves (see FIGS. 1A-1C or 3A-3B) in order to achieve a uniform, e.g. angular, distribution of the interleaves independent of a time interval over which the interleaves are acquired. The combination of the sampling pattern with an FID navigator (or equivalent motion detection methods) placed at the beginning of each TR for motion detection and guiding the computation of such low resolution image to obtain motion parameters improves the quality of final images obtained by MRI. Advantageously, such combined scheme for optimized motion correction in brain MRI acquisitions comes along with no or little extra scan time.

Figure 4:
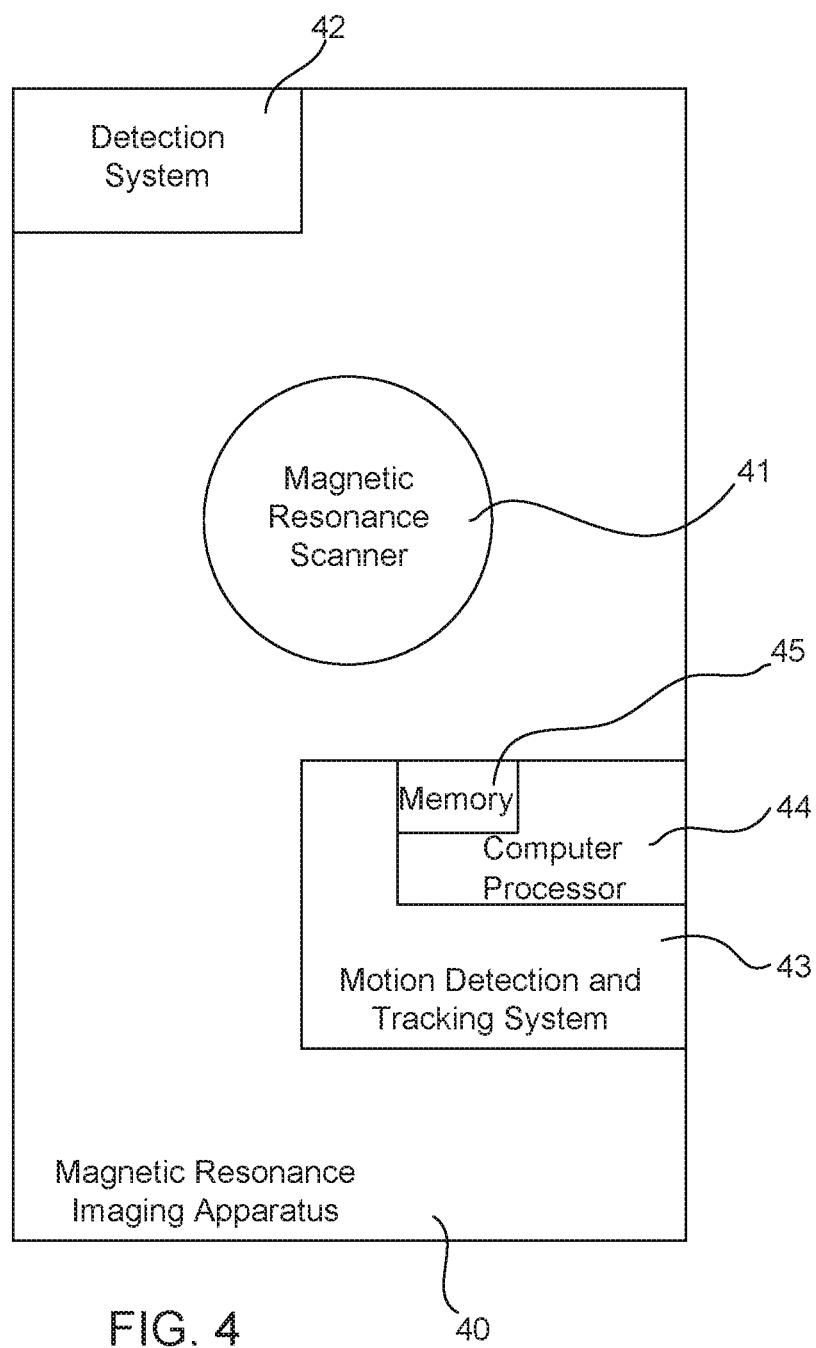
FIG. 4 is an illustration of a magnetic resonance imaging apparatus according to the invention.

FIG. 4 is an illustration of a magnetic resonance imaging apparatus 40 having a magnetic resonance scanner 41 configured for generating a magnetic field gradient and a radio-frequency signal for performing a magnetic resonance scan of a subject/object. The radio-frequency signal contains a repetition of pulse sequences, each of the pulse sequences starting with a radio-frequency excitation pulse and a time separating two successive radio-frequency excitation pulses is defined as a repetition time of a pulse sequence. The magnetic resonance imaging apparatus 40 further has a detection system 42 configured for detecting and acquiring MRI readout signals emitted from the subject/object in response to the magnetic field gradient and the radio-frequency signal and a motion detection and tracking system 43 configured for detecting and tracking a subject/object motion and determining subject/object motion parameters. The subject/object motion parameters contain at least time-points in which motion has occurred, the motion detection and tracking system 43 has a computer processor 44 and a memory storage 45.

The invention claimed is:

1. A computer-implemented method for subject/object motion detection and correction during a magnetic resonance imaging (MRI) scan, which comprises the steps of:
   generating, via a magnetic resonance scanner, a magnetic field gradient and a radio-frequency signal for the MRI scan, the radio-frequency signal having a successive repetition of at least one pulse sequence, the pulse sequence starting with a radio-frequency excitation pulse, a time between two successive radio-frequency excitation pulses being defined as a repetition time;
   detecting, from a readout signal emitted in response to the pulse sequence, time-points in which motion of a subject/object has occurred, the detecting being realized via a motion detection technique configured for detecting occurrences of subject/object motion in dependence on a time during the MRI scan;
   automatically creating motion-free interleaves via a computer processor by sampling of k-space that is performed with an MRI apparatus by disposing k-space readout signals acquired over the repetition time of the pulse sequence into several groups of interleaves characterized by a uniform sampling of the k-space and achieving a uniform angular distribution by utilizing golden angle displacement between successive interleaves of the k-space;
   reconstructing separately each subset of interleaves with the computer processor obtaining low resolution MR images;
   using the low resolution images when determining motion parameters via a computational technique and by registration to a predetermined reference image; and
   using the motion parameters in order to improve a quality of images obtained during the MRI scan.

2. The computer-implemented method according to claim 1, which further comprises using a navigator technique as the motion detection technique.

3. The computer-implemented method according to claim 2, wherein the motion detection technique is a free induction decay navigator technique containing an excitation pre-pulse performed after a delay that occurs after each RF excitation pulse delimiting successive pulse sequences, and followed then by an analog-digital-converter readout in an absence of any gradients.

4. The computer-implemented method according to claim 3, wherein the excitation pre-pulse is an ultra-short free induction decay RF signal configured for monitoring a k-space center in a manner free of any spatial gradient encoding, where ultra-short is defined as less than 100 micro-seconds.

5. The computer-implemented method according to claim 1, wherein the radio-frequency excitation pulse is an inversion pulse.

6. The computer-implemented method according to claim 1, which further comprises performing a sampling of the k-space according to a spiral and/or radial pattern.

7. A magnetic resonance imaging apparatus, comprising:
a magnetic resonance scanner configured for generating a magnetic field gradient and a radio-frequency signal for performing a magnetic resonance scan of a subject/object, the radio-frequency signal containing a repetition of pulse sequences, each of the pulse sequences starting with a radio-frequency excitation pulse and a time separating two successive radio-frequency excitation pulses being defined as a repetition time of a pulse sequence;
a detection system configured for detecting and acquiring MRI readout signals emitted from the subject/object in response to the magnetic field gradient and the radio-frequency signal;
a motion detection and tracking system configured for detecting and tracking a subject/object motion and determining subject/object motion parameters, the subject/object motion parameters containing at least timepoints in which motion has occurred, said motion detection and tracking system containing a computer processor and a memory storage having instructions for:
automatically creating from MRI readout signals motion-free interleaves, wherein a sampling of k-space is performed by arranging k-space MRI readout signals acquired over each of the repetition times (TR) of the pulse sequence into several groups of interleaves characterized by a uniform sampling of the k-space and achieving a uniform angular distribution by utilizing golden angle displacement between successive interleaves of the k-space;
reconstructing separately each subset of motion-free interleaves for obtaining low resolution MR images;
using the low resolution images when determining motion parameters by means of a computational technique and by registration to a predetermined reference image; and
using the subject/object motion parameters to improve a quality of images obtained during the MRI scan.

8. The magnetic resonance imaging apparatus according to claim 7, further comprising a motion correction system configured for automatically correcting effects of the subject/object motion during MRI scan.

9. The magnetic resonance imaging apparatus according to claim 7, wherein said memory storage contains further instructions that perform a navigator technique when detecting and tracking the motion of the subject/object.

10. The magnetic resonance imaging apparatus according to claims 7, wherein said detection system is configured for sampling the k-space according to a spiral and/or radial pattern.

* * * * *